US006928634B2

(12) United States Patent
Granik et al.

(10) Patent No.: US 6,928,634 B2
(45) Date of Patent: Aug. 9, 2005

(54) MATRIX OPTICAL PROCESS CORRECTION

(76) Inventors: Yuri Granik, 554 Driscoll Pl., Palo Alto, CA (US) 94306; Nicolas Cobb, 1632 Willow Lake La., San Jose, CA (US) 95131

( * ) Notice: Subject to any disclaimer, the term of this patent is extended or adjusted under 35 U.S.C. 154(b) by 0 days.

(21) Appl. No.: 10/387,224

(22) Filed: Mar. 10, 2003

(65) Prior Publication Data

US 2004/0133871 A1 Jul. 8, 2004

Related U.S. Application Data

(60) Provisional application No. 60/437,874, filed on Jan. 2, 2003.

(51) Int. Cl.[7] .............................................. G06F 17/50
(52) U.S. Cl. .............................. 716/19; 716/20; 716/21
(58) Field of Search ................ 716/19–21; 703/13–16; 382/144–145

(56) References Cited

U.S. PATENT DOCUMENTS

| | | | | |
|---|---|---|---|---|
| 4,532,650 A | * | 7/1985 | Wihl et al. | 382/144 |
| 4,762,396 A | | 8/1988 | Dumant et al. | |
| 5,502,654 A | | 3/1996 | Sawahata | |
| 5,655,110 A | | 8/1997 | Krivokapic et al. | |
| 5,699,447 A | * | 12/1997 | Alumot et al. | 382/145 |

(Continued)

FOREIGN PATENT DOCUMENTS

JP 09319067 A 12/1997
WO WO 01/65315 A2 9/2001

OTHER PUBLICATIONS

Cobb, N., and Y. Granik, "Model–Based OPC Using the MEEF Matrix," *Proceedings of SPIE, vol. 4889: 22nd Annual BACUS Symposium on Photomask Technology*, Monterey, Calif., Sept. 30–Oct. 4, 2002, p. 147.

Cobb, N., and A. Zakhor, "Experimental Results on Optical Proximity Correction With Variable Threshold Resist Model," *Proceedings of SPIE, vol. 3051: Symposium on Optical Microlithography X*, Santa Clara, Calif., Mar. 10–14, 1997, pp. 458–468.

(Continued)

*Primary Examiner*—Vuthe Siek
*Assistant Examiner*—Naum Levin
(74) *Attorney, Agent, or Firm*—Christensen O'Connor Johnson Kindness PLLC

(57) ABSTRACT

A method for performing a matrix-based verification technique such as optical process correction (OPC) that analyzes interactions between movement of a fragment on a mask and one or more edges to be created on a wafer. In one embodiment, each edge to be created is analyzed and one or more fragments of a mask are moved in accordance with a gradient matrix that defines how changes in position of a fragment affect one or more edges on the mask. Fragments are moved having a significant effect on an edge in question. Simulations are performed and fragments are moved in an iterative fashion until each edge has a objective within a prescribed tolerance. In another embodiment, each edge has two or more objectives to be optimized. A objective is selected in accordance with a cost function and fragments are moved in a mask layout until each edge has acceptable specification for each objective.

16 Claims, 8 Drawing Sheets

U.S. PATENT DOCUMENTS

| | | | |
|---|---|---|---|
| 5,723,233 | A | 3/1998 | Garza et al. |
| 5,825,647 | A | 10/1998 | Tsudaka |
| 5,879,844 | A | 3/1999 | Yamamoto et al. |
| 6,016,357 | A | 1/2000 | Neary et al. |
| 6,049,660 | A | 4/2000 | Ahn et al. |
| 6,077,310 | A | 6/2000 | Yamamoto et al. |
| 6,120,952 | A | 9/2000 | Pierrat et al. |
| 6,128,067 | A | 10/2000 | Hashimoto |
| 6,187,483 | B1 | 2/2001 | Capodieci et al. |
| 6,243,855 | B1 | 6/2001 | Kobayashi et al. |
| 6,249,904 | B1 | 6/2001 | Cobb |
| 6,263,299 | B1 | 7/2001 | Aleshin et al. |
| 6,269,472 | B1 | 7/2001 | Garza et al. |
| 6,301,697 | B1 | 10/2001 | Cobb |
| 6,317,859 | B1 | 11/2001 | Papadopoulou |
| 6,370,679 | B1 | 4/2002 | Chang et al. |
| 6,425,117 | B1 | 7/2002 | Pasch et al. |
| 6,453,452 | B1 | 9/2002 | Chang et al. |
| 6,453,457 | B1 | 9/2002 | Pierrat et al. |
| 6,467,076 | B1 | 10/2002 | Cobb |
| 6,499,003 | B2 | 12/2002 | Jones et al. |
| 6,665,845 | B1 | 12/2003 | Aingaran et al. |
| 6,792,159 | B1 * | 9/2004 | Aufrichtig et al. .......... 382/260 |
| 2002/0199157 | A1 * | 12/2002 | Cobb ............................. 716/1 |
| 2004/0005089 | A1 * | 1/2004 | Robles et al. ............... 382/141 |
| 2004/0088149 | A1 * | 5/2004 | Cobb ........................... 703/13 |

OTHER PUBLICATIONS

Cobb, N., and A. Zakhor, "Fast, Low–Complexity Mask Design," *Proceedings of SPIE, vol. 2440: Symposium on Optical/Laser Microlithography VIII,* Santa Clara, Calif., Feb. 22–24, 1995, pp. 313–327.

Cobb, N., and A. Zakhor, "Fast Sparse Aerial Image Calculation for OPC," *Proceedings of SPIE, vol. 2621: 15th Annual BACUS Symposium on Photomask Technology and Management,* Santa Clara, Calif., Sep. 20–22, 1995, pp. 534–545.

Cobb, N., and A. Zakhor, "Large Area Phase–Shift Mask Design," *Proceedings of SPIE, vol. 2197: Symposium on Optical/Laser Microlithography VII,* San Jose, Calif., Mar. 2–4, 1994, pp. 348–360.

Cobb., N., et al., "Mathematical and CAD Framework for Proximity Correction," *Proceedings of SPIE, vol. 2726: Symposium on Optical Microlithography IX,* Santa Clara, Calif., Mar. 13–15, 1996, pp. 208–222.

Cobb, N., and Y. Granik, "Using OPC to Optimize for Image Slope and Improve Process Window," (Nov. 20, 2002), *Proceedings of SPIE, vol. 5130: Photomask Japan,* Yokohama, Japan, Apr. 16–18, 2003, p. 42.

Granik, Y., "Generalized MEEF Theory," *Interface 2001,* Nov. 2001.

Granik, Y., and N. Cobb, "MEEF as a Matrix," *Proceedings of SPIE, vol. 4562: 21st Annual BACUS Symposium on Photomask Technology,* Monterey, Calif., Oct. 2–5, 2001, pp. 980–991.

Granik, Y., and N. Cobb, "Two–Dimensional G–MEEF Theory and Applications," *Proceedings of SPIE, vol. 4754: Symposium on Photomask and Next–Generation Lithography Mask Technology IX,* Yokohama, Japan, Apr. 23–25, 2002, pp. 146–155.

Maurer, W., et al., "Process Proximity Correction Using an Automated Software Tool," *Proceedings of SPIE, vol. 3334: Optical Microlithography XI,* Santa Clara, Calif., Feb. 22–27, 1998, pp. 245–253.

Maurer, W., et al., "Evaluation of a Fast and Flexible OPC Package: OPTISSIMO," *Proceedings of SPIE, vol. 2884: 16th Annual Symposium on Photomask Technology and Management,* Redwood City, Calif., Sep. 18–20, 1996, pp. 412–418.

Ohnuma, H., et al., "Lithography Computer Aided Design Technology for Embedded Memory in Logic," *Japanese Journal of Applied Physics* 37(12B):6686–6688, Dec. 1998.

* cited by examiner

MATRIX OPTICAL PROCESS CORRECTION

CROSS-REFERENCE TO RELATED APPLICATION

The present application claims the benefit under 35 U.S.C. § 119(e) of the U.S. Provisional Application No. 60/437,874, filed Jan. 2, 2003, titled USING OPC TO OPTIMIZE FOR IMAGE SLOPE AND IMPROVE PROCESS WINDOW, which is herein incorporated by reference.

FIELD OF THE INVENTION

The present invention relates to semiconductor layout verification techniques, and in particular to methods of enhancing the manufacturability of circuit designs that are created by photolithography.

BACKGROUND OF THE INVENTION

The most common technique for forming circuit elements on a semiconductor wafer is by photolithographic printing whereby one or more reticles (also more commonly called masks or photomasks) are used to form a pattern and selectively expose areas of photosensitive resist layers on the wafer. As integrated circuits become more complex, the number of circuit elements to be created on a wafer become increasingly large and each object becomes correspondingly smaller. As the size of the objects to be created become similar in size or smaller than the wavelength of light used to illuminate the wafer, distortions occur whereby the pattern of objects formed on the wafer do not correspond to the pattern of objects defined by the mask. One objective criterion that defines how well an image is formed or an object is created is the edge placement error (EPE) that indicates how far an edge of an object is shifted from its desired position. Another objective criterion is the edge contrast or slope that describes how sharply the image intensity changes from exposed to not exposed, or vice versa.

To improve the manufacturability of target layout designs, optical process correction (OPC) techniques have been developed that alter a mask layout pattern in order to correctly create the desired pattern of objects on a wafer. The conventional OPC method of improving the fidelity of a layout is to simulate how a pattern of polygon fragments fabricated on a mask will be lithographically reproduced as corresponding edges on the wafer, and then moves the fragment such that the edge on the wafer will be created at the proper location.

In a typical OPC procedure, a target layout comprising several polygons represents the objects desired on the wafer. As shown in FIG. 1A, the polygons 1 in this layout are divided up into several edges 2a, 2b, 2c, etc. For each of the edges, a simulation site 3c, 3d, etc. (also called a control point) is designated. Some edges may have more than one simulation site, although typically there is one site per edge.

A simulation of the image that will be formed if the target layer is used as the mask layout is then run. Simulations are generated at each of the sites of the edges, usually along a cut line perpendicular to the edge, and measurements of the predicted image slope, maximum and minimum intensities are calculated as shown in FIG. 1B. From these image parameters, the actual placement of the edge is predicted using techniques such as the variable threshold resist model, or other simulation techniques. The edge location as predicted and the location of the ideal edge in the target layout are then compared, and the difference calculated as an edge placement error (EPE).

Changes are then made in the mask layout to minimize the EPE. For each edge, a fragment in the mask layout is designated, and each mask fragment is moved in an attempt to reduce the EPE. New simulations at the sites are then generated from the revised mask layout, and new EPEs calculated. This procedure is repeated iteratively until the EPE is small enough, i.e., is within a certain tolerance value.

It has since been recognized that a fragment on a mask often affects more than one corresponding edge on a wafer. Each fragment can potentially affect the creation of many edges that lie within a predefined optical radius. To accurately model these effects, matrix-based computation of the Mask Error Enhancement Factor (MEEF) was developed by Yuri Granik and Nicolas Cobb of Mentor Graphics Corporation, the assignee of the present invention, and others. In matrix-based MEEF computations, the interaction of a single fragment on a mask with many edges to be created on a wafer is considered. In principle, the inverse is also possible, in which the relationship of multiple fragments on a mask with a single edge on a wafer can also be considered. More complex multi-fragment interactions with multi-edge results can also be evaluated.

This matrix formulation can also be applied in the context of OPC. However, in practice, matrix-based OPC has been difficult to implement. First, the matrices that define the relationship between a mask fragment and a number of edges to be created on a wafer are often large and can be difficult to mathematically invert in order to calculate an exact solution for the optimal position of each fragment on the mask. Secondly, an exact solution for each fragment position on a mask does not necessarily ensure the manufacturability of a layout design under a variety of process conditions where variations may occur in illumination, focus, or other conditions. Therefore, there is a need for a method of enhancing the manufacturability of a target layout under a variety of process conditions that takes into consideration each mask fragment's effect on multiple edges on a wafer.

SUMMARY OF THE INVENTION

The present invention is a method for performing optical process correction (OPC) or other verification techniques that analyze the interaction between a fragment in a mask layout and one or more edges to be created on a wafer. In one embodiment, a gradient matrix is calculated that defines the relationship between the movement of a fragment and an objective of one or more edges to be created. Each edge to be created on a mask is analyzed and one or more fragments are moved that have the greatest effect on the edge in question as specified by the gradient matrix.

In another embodiment of the invention, a plurality of optimization criteria or objectives are defined for each edge to be created on a wafer. The change in each optimization criterion versus a change in position of a mask fragment is defined by a gradient matrix. A cost function is used to select one of the plurality of objectives for optimization and fragments are moved in the mask layout until each edge has objectives within a prescribed tolerance. In one specific embodiment of the invention, edge placement error (EPE) and slope define the optimization criteria.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1A:
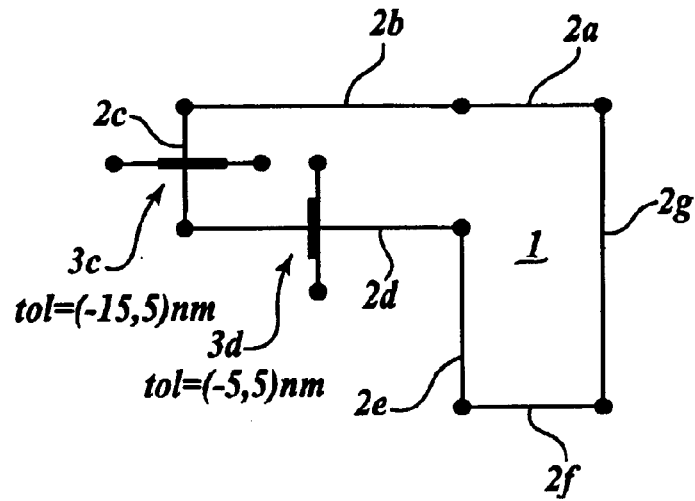
FIGS. 1A and 1B illustrate a fragmented polygon in a target layout and a measurement of an edge placement error computed for a simulation site of an edge.
Figure 1B:
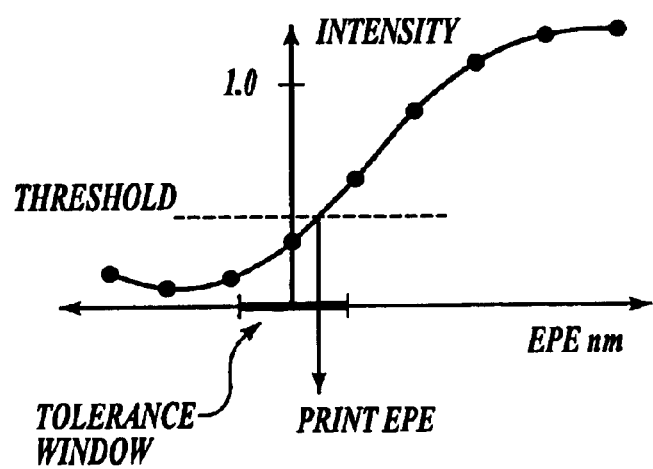
Figure 2:
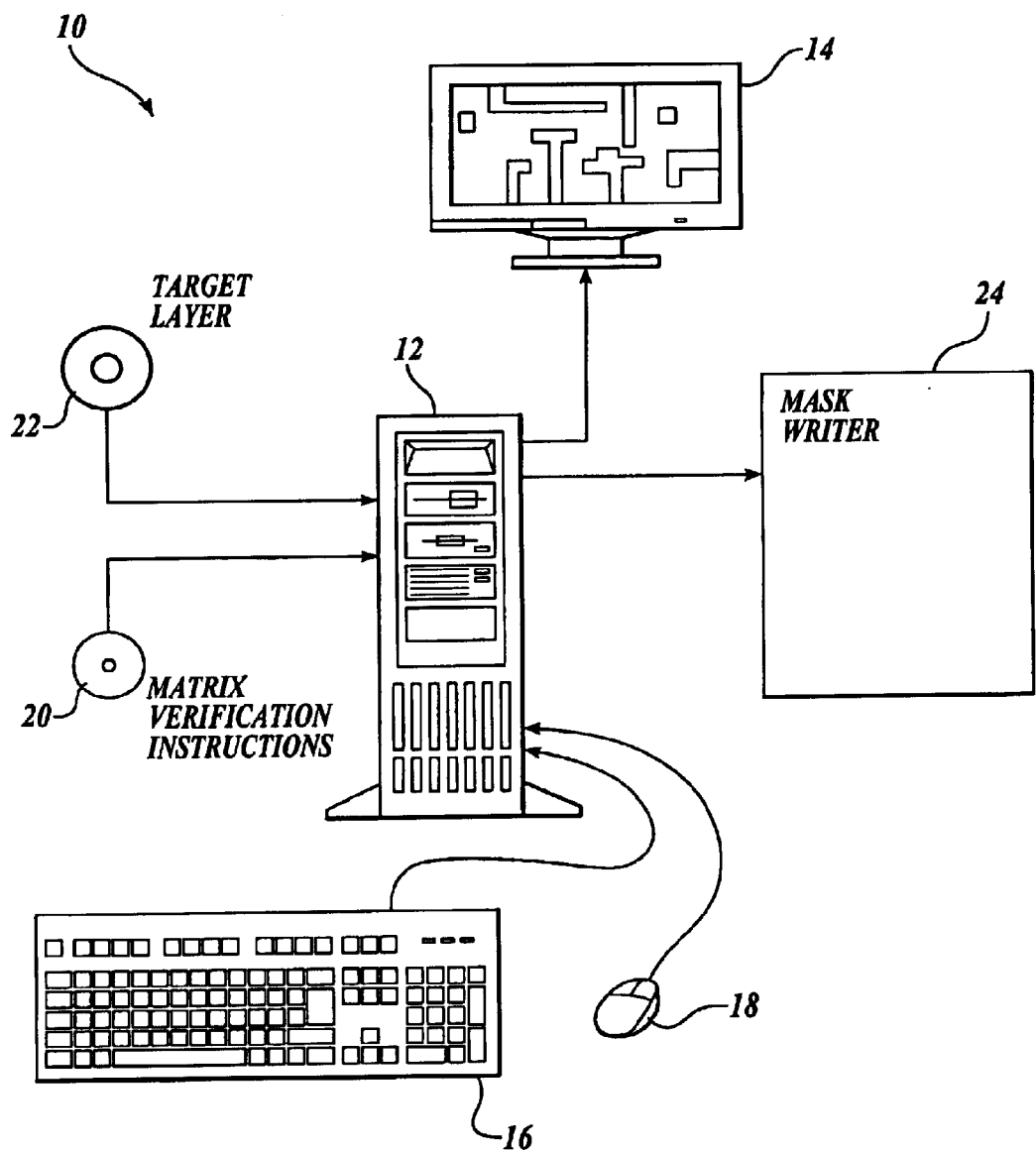
FIG. 2 illustrates one embodiment of a suitable computer system that is used to implement the matrix-based verification technique in accordance with the present invention.

FIG. 2 illustrates one embodiment of a computer system that is used to perform a matrix-based verification technique such optical process correction (OPC) in accordance with the present invention. The computer system 10 includes a stand-alone or networked processor 12 having a visual display 14 and data input mechanism such as a keyboard 16 and mouse 18. Instructions used by the processor 12 to implement the matrix-based verification technique of the present invention are received on a computer readable media such as a CD-ROM or DVD 20 or can be received as a communication signal from a remote computer over a wired or wireless data link. As will be described in further detail below, the processor 12 receives a target layer description that defines a number of circuit elements to be created on a semiconductor wafer. The target layer description is received on a computer readable media 22 or can be received from a remote computer over a wired or wireless data communication link. The computer processor 12 creates a mask layout description of one or more lithographic masks that will be used to expose desired portions of a wafer in order to create the circuit elements on the semiconductor wafer. The mask layout is exported to a mask writer 24 that produces the physical mask(s) to be used in a wafer processing facility.

Figure 3A:
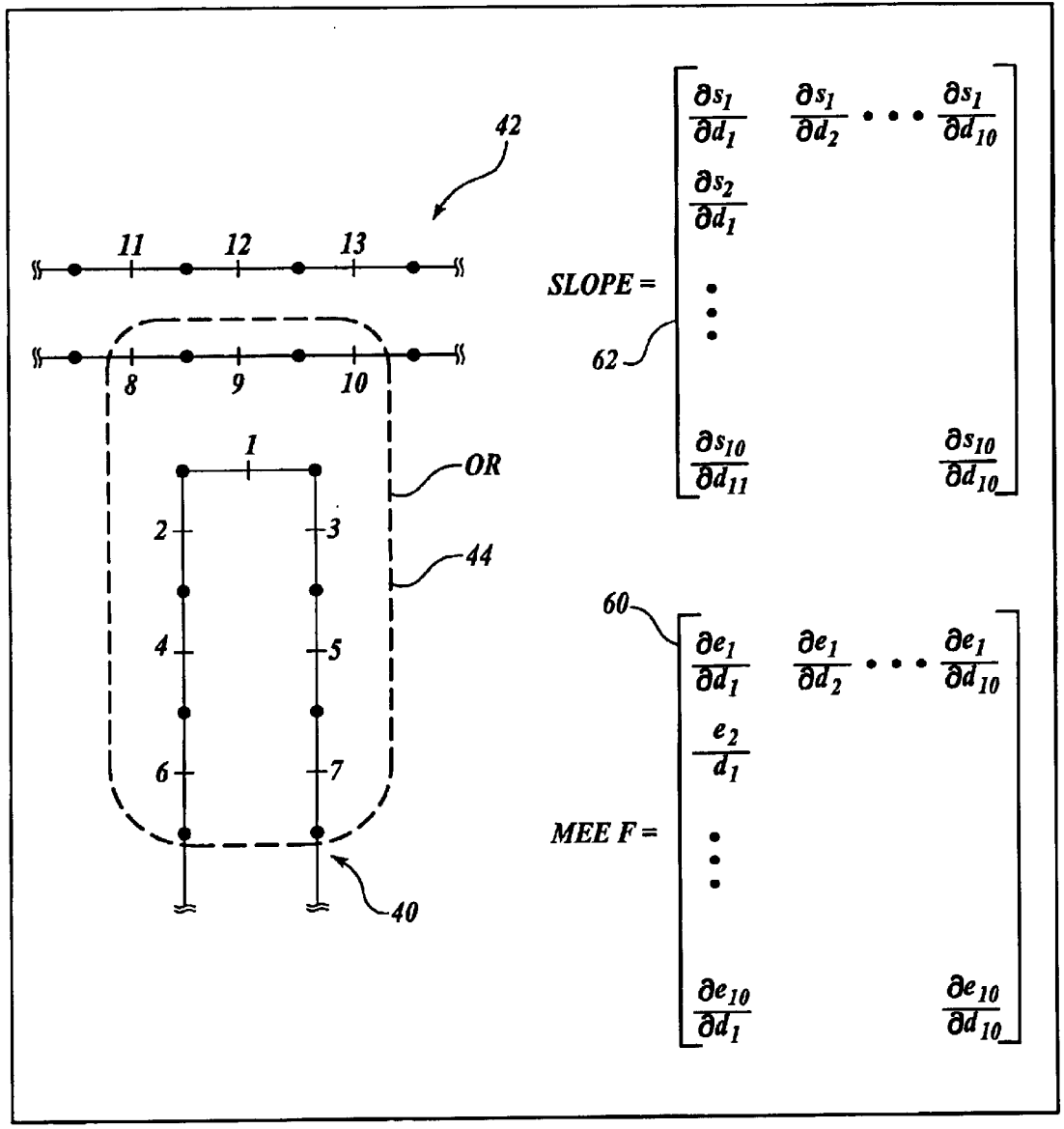
FIG. 3A illustrates a portion of a target layer and a number of matrices that relate optimization criteria of edges in the target layer to a change in position of different fragments within a mask layout.

FIG. 3A illustrates a portion of a target layer description that defines circuit elements to be created on a semiconductor wafer. The circuit elements in the target layer include a vertical line 40 that is perpendicular to a horizontal line 42. In accordance with conventional practices, the lines 40, 42, are fragmented into a number of edges. Each edge is catalogued and stored in a database for analysis to determine how to create the edge on a wafer. The database may also include additional information for each edge including its resist threshold, control points or sites associated with each edge where measurements are to be made to test various objectives, etc.

As indicated above, the circuit elements are created on a wafer by exposing the wafer through one or more masks. The masks include patterns of clear and opaque areas that selectively expose desired regions on the wafer. Certain regions on the masks may also be phase-shifted. To ensure that the objects on the wafer will be printed correctly, the verification tool adjusts the patterns in the mask layout to correct for optical distortions and other errors that may occur during the printing process. Generally each edge to be created on the wafer corresponds with a fragment in a mask layout. However, there may be fragments in the mask layout that do not correspond with edges on the wafer. For example, fragments that define subresolution features such as assist features, etc., are defined in the mask layout but do not define circuit elements to be created in a wafer. For purposes of the present specification, the term "edge or edges" refers to portions of a circuit element or feature to be created on a wafer while a "fragment" refers to a portion of a pattern defined in a mask layout.

Each fragment in a mask layout potentially affects the characteristics of multiple edges to be created on a wafer. Generally, the interaction is limited to those edges within an optical radius (OR) positioned around the edge that corresponds to the fragment in question. For example, FIG. 3A shows an optical radius 44 generally centered around an edge collection comprising edges 1, 2, 3, 4, and 5. The interaction of a fragment on edges that are created by neighboring fragments in the mask layout may be described by a gradient matrix. Each element of the gradient matrix defines how a manufacturing criteria or objective of a particular edge varies in accordance with movement of a fragment in the mask layout. For example, the edge placement error (EPE) of each edge is determined by a MEEF matrix 60. Each row in the MEEF matrix 60 defines how the edge placement error of a single edge in the wafer layer changes with movement of nearby fragments in the mask layout. Similarly, a slope matrix 62 comprises a gradient matrix having elements that define how the slope of a single edge in the target layer varies with a change in position of other fragments in the mask layout. Conversely, each column of the slope matrix defines how a change in the position of a particular fragment in a mask layout affects the slope for edges created from nearby fragments in the mask layout.

The edge placement error (EPE) and slope (i.e., contrast) of an edge in a target layer comprise two of many possible criteria that can be optimized in order to improve the manufacturability of a target layer on a wafer. Other criteria such as the maximum intensity, Imax, along the cutline, the minimum intensity, Imin, on the cutline, an intensity value at some designated point along the cutline, the slope at the target layer edge position, the curvature at the target layer edge position, a local density function, etc. could also be optimized and defined as a matrix that relates changes in the optimization criteria to changes in position of the fragments in the mask layout.

Figure 3B:
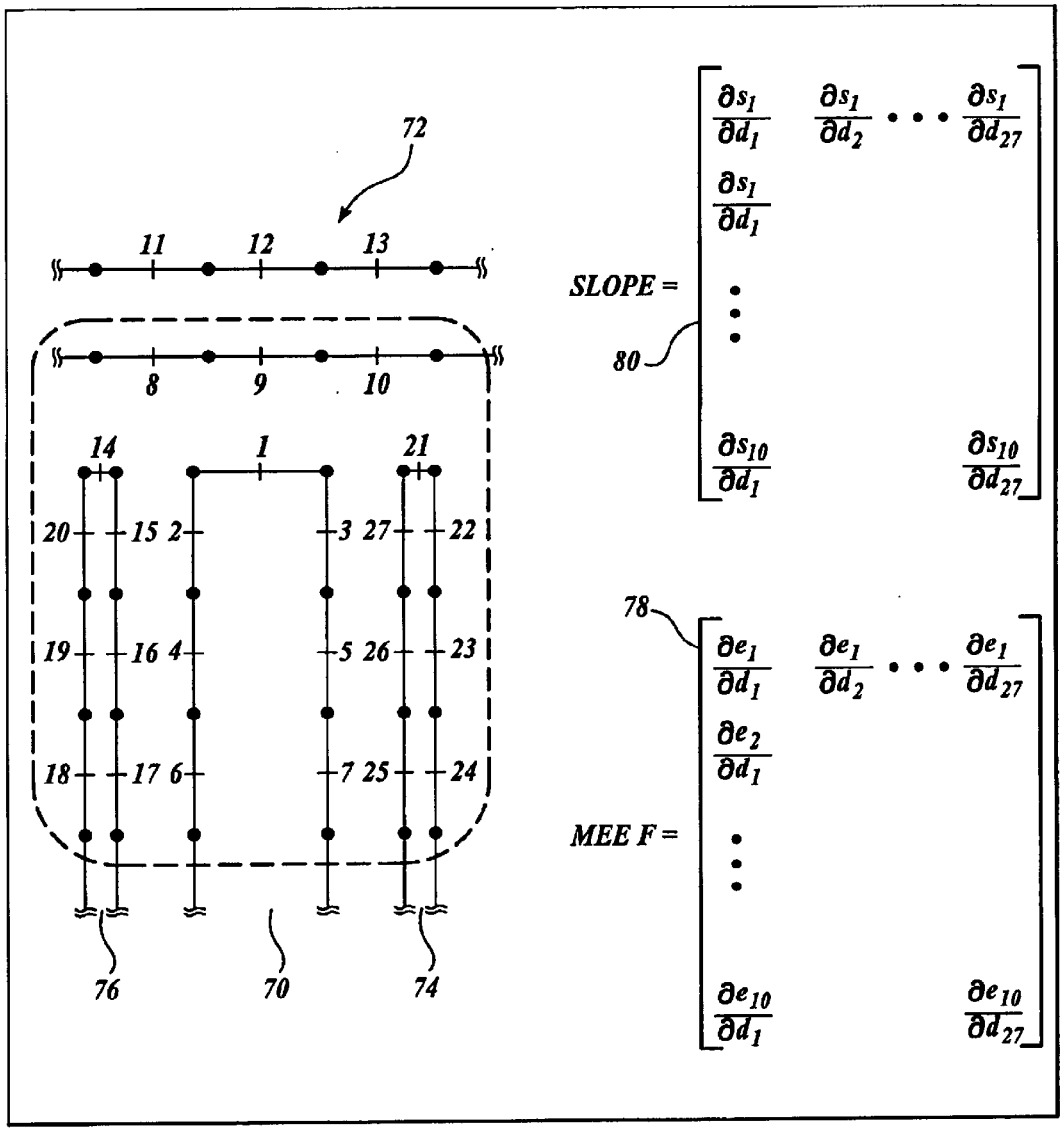
FIG. 3B illustrates a portion of a mask layout and a number of matrices that relate optimization criteria of edges in the target layer to a change in position of different fragments in the mask layout.
Figure 4:
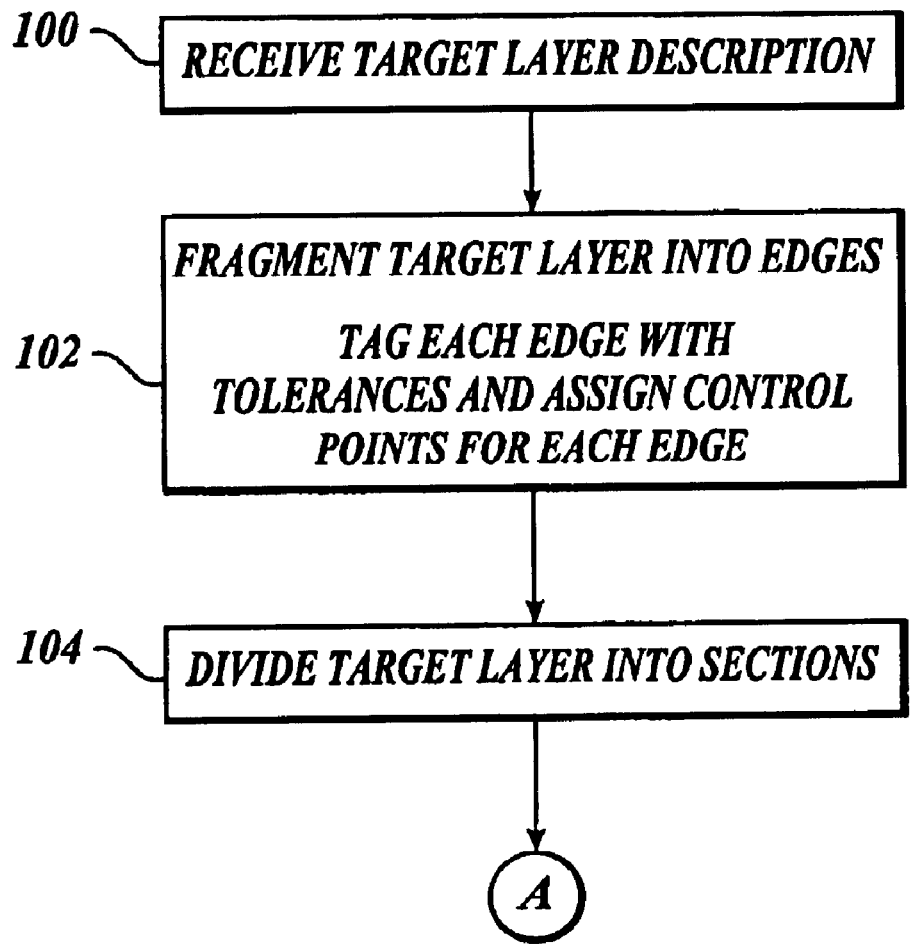
FIG. 4 is a flowchart showing a number of actions used to prepare a mask layout design for matrix-based OPC in accordance with one embodiment of the present invention.
Figure 5:
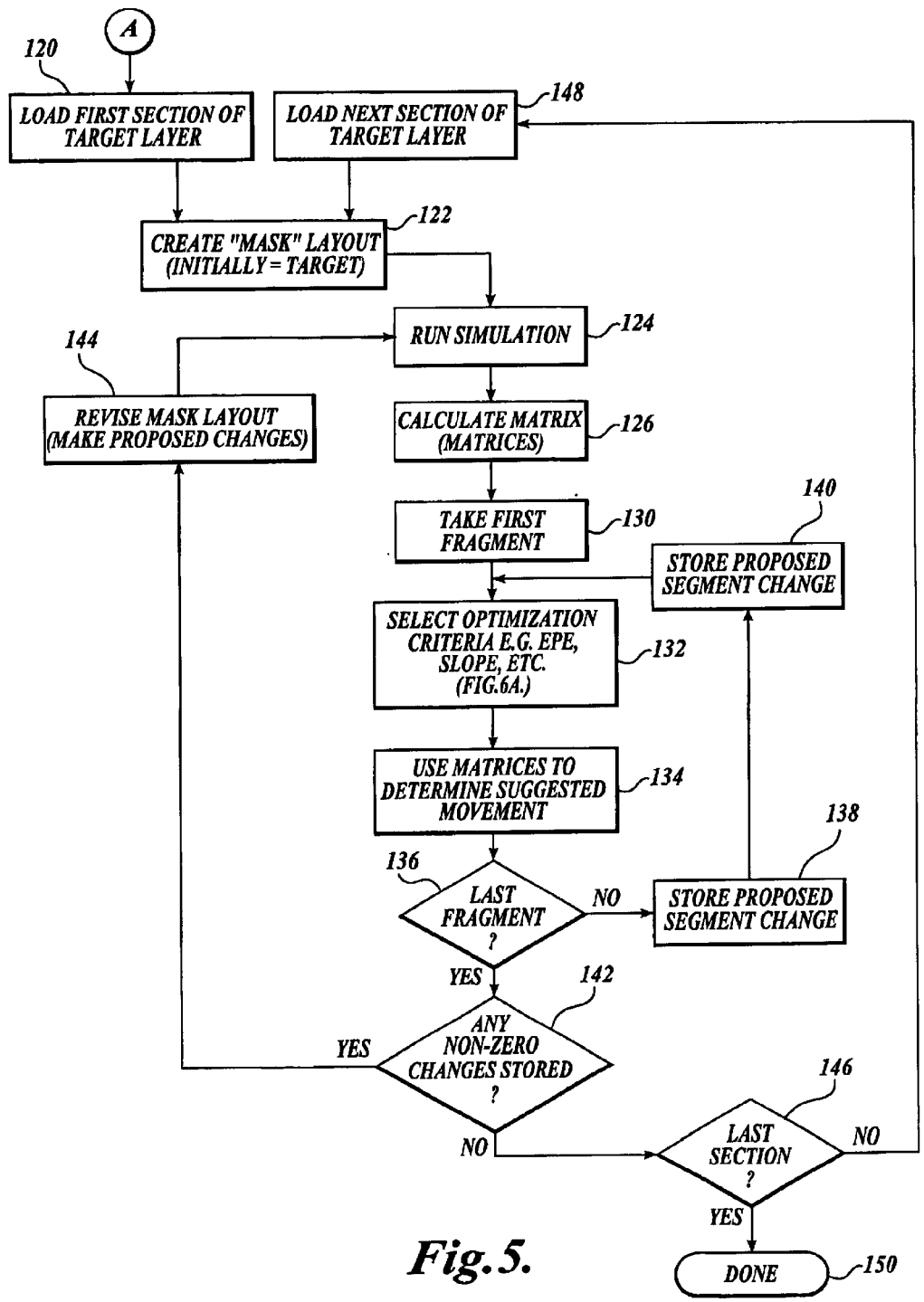
FIG. 5 is a flowchart of a number of actions used to perform matrix-based OPC in accordance with one embodiment of the present invention.
Figure 6A:
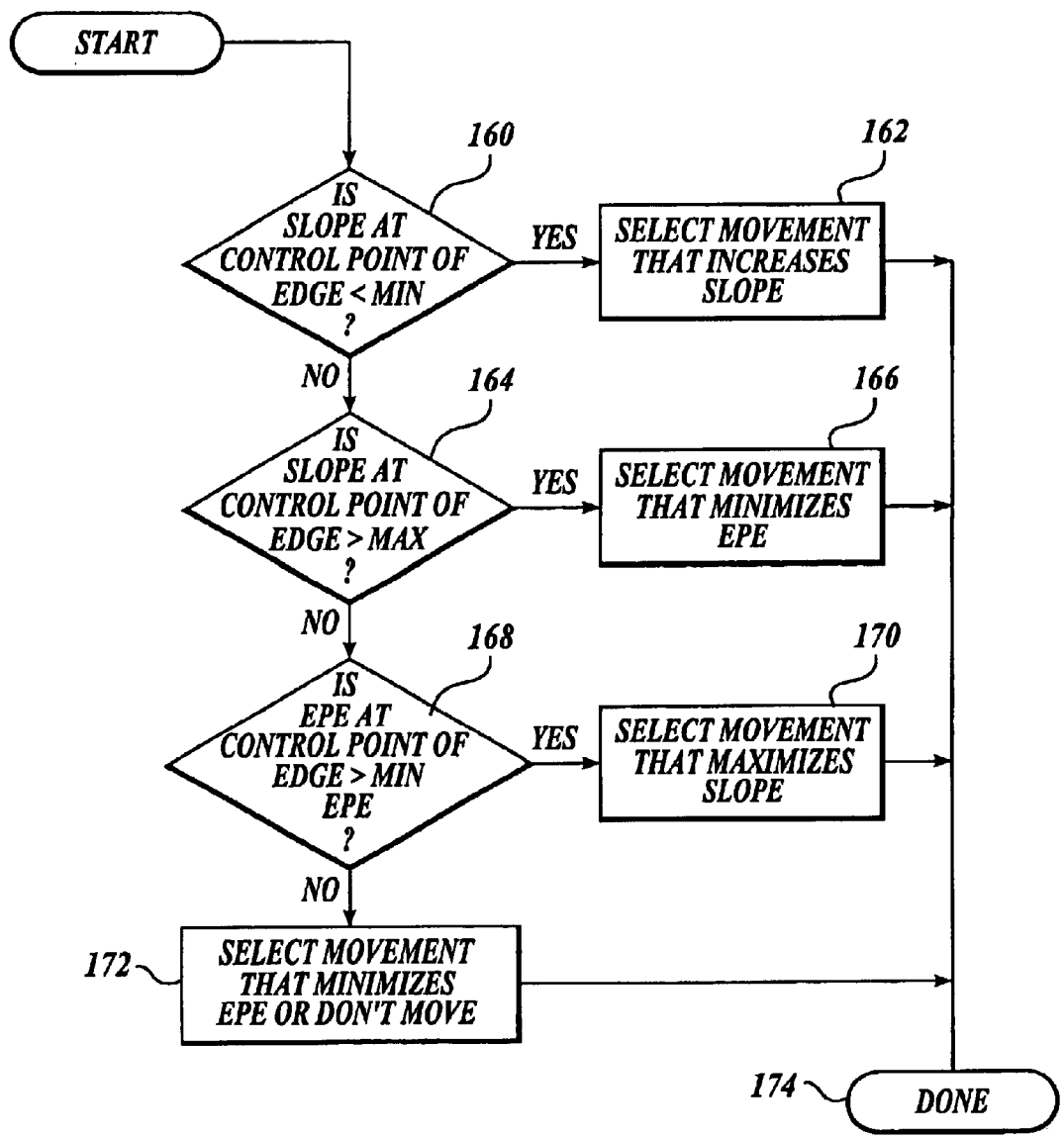
FIG. 6A is a flowchart of a number of actions used to select between several optimization criteria in accordance with one embodiment of the present invention.
Figure 6B:
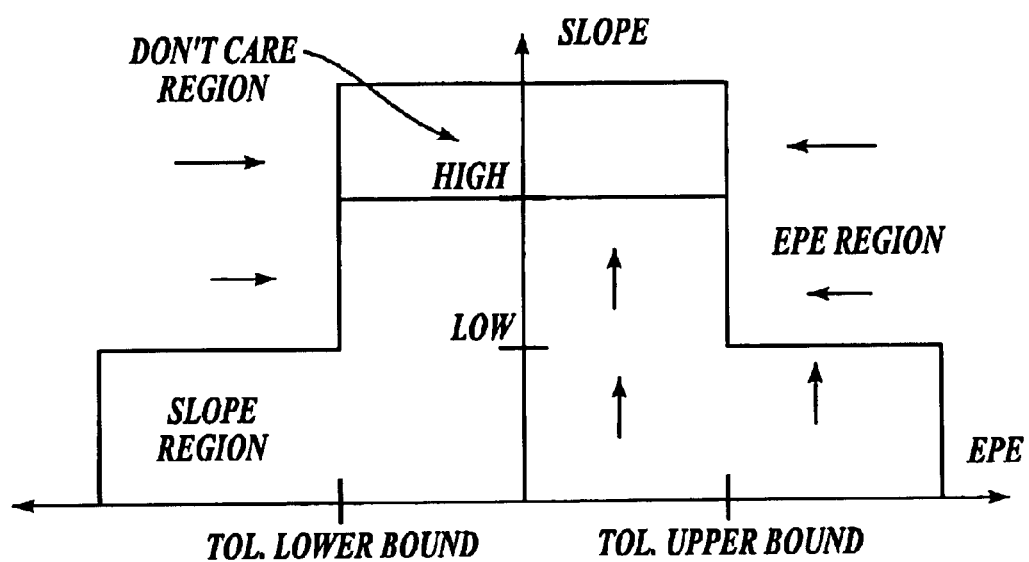
FIG. 6B graphically illustrates a cost function for selecting between two optimization criteria or objectives in accordance with one embodiment of the present invention.

FIG. 3B illustrates a portion of a mask layout including a number of fragments (numbered 1–10) that correspond to edges to be created on a wafer. In addition, the mask layout includes vertical two assist features 74, 76 having fragments numbered 14–20 and 21–27. These fragments will not create edges on a wafer because they define sub-resolution features.

Matrices 78, 80 are defined that describe how a particular objective criteria for an edge corresponding to a fragment is affected by the placement of the fragments. As will be appreciated, the matrices 78, 80 are generally not square because there are fewer edges with simulation sites on the wafer than there are fragments in the mask layout.

It should be noted, however, that although the preferred embodiment of the invention uses predetermined numbers of fragments and edges, the number of fragments and simulation sites may increase or decrease between iterations. Criteria for these changes can be determined through a number of heuristics, depending on the user's requirements. For example, assist features may be left out of the matrix calculations, and indeed may be left out of the mask layout altogether in the early iterations of a simulation. They would be inserted as fragments in the mask layout, and the matrix calculations appropriately adjusted to include their effects, only if contrast objectives remain below a certain threshold.

FIGS. 4–6A and 6B illustrate a series of actions performed by one embodiment of the present invention to optimize two or more manufacturing criteria or objectives of circuit elements to be created on a wafer while taking into account each fragment's effect on multiple edges. Beginning at 100, a target layer description is received by a computer system. The target layer description may be provided on one or more computer readable media such as magnetic tapes, CD-ROMS, DVDs, etc., or may be received over a wired or wireless communication link. At 102 the target layer is fragmented by dividing each object to be created into a number of edges. Each edge has defined endpoints that are stored in a database. Other data for the edges may be generated and stored including one or more objectives such as a maximum acceptable edge placement error (EPE), desired slope, the position of a control point at which measurements for the edge are to be determined, and other criteria useful for performing OPC and other target layer verifications.

At 104, the collection of edges in the target layer is divided into a number of sections, wherein each section preferably includes objects within an optical radius of each other. In some instances, it may desirable to include a buffer region around a section such that no fragments that create the edges within a section interact with, or affect, the creation of edges in an adjacent section. Once the target layer description has been received, fragmented, and divided into sections, each section is processed in order to optimize the position of the fragments in one or more mask layouts such that the edges will be created at the desired location and with the required objectives on a wafer. One possible method of analyzing each target layer section is set forth in FIGS. 5, 6A and 6B.

Beginning at 120, a processor begins a loop, wherein each section of a target layer is processed. At 122, a mask layout is defined that will create the target layer on a wafer during semiconductor processing. Initially, the mask layout comprises a number of polygons having fragments corresponding to the edges in the target layer. That is, the position of each edge defined in the target layer corresponds to the position of a fragment in the mask layout. However, the position of the fragments may change as a result of OPC or other verification tools. Furthermore, there may be some fragments that are created in the mask layout that do not correspond to edges in the target layer. For example, assist features may be added to the mask layout that do not form objects on a wafer in order to enhance the resolution of the edges on a wafer.

At 124, a simulation is performed that estimates how the mask layout at 122 will create corresponding edges on a wafer. The simulation may calculate a number of objective criteria for each edge. In accordance with one embodiment of the present invention the simulation calculates at least an edge placement error (EPE) and slope measured for each control point on an edge. At 126, gradient matrices are computed that estimate how the objective criteria varies with a change in the position of a fragment in the mask layer. In one embodiment, the simulation at 126 is performed using a defocused image and possibly under worst case focus conditions under the assumption that if the focus is improved, the results will only get better.

As indicated above, one embodiment of the present invention utilizes the edge placement error and slope as two criteria used to improve the resolution of the edges on a wafer. The edge placement error of an edge versus a change in position of a number of fragments in the mask layer may be described by a MEEF matrix 78. Similarly, a slope matrix 80 describes the relationship between the slope of an edge and a corresponding change in position of a number of fragments in a mask layout. The MEEF matrix 78 may be calculated as disclosed in "MEEF as a Matrix," by Yuri Granik and Nicolas Cobb, Proceedings of SPIE, volume 4562 (2002), pages 980–991, "Two-Dimensional g-MEEF Theory and Applications," by Yuri Granik, Nicolas Cobb, Proceedings of SPIE, volume 4754 (2002), pages 146–155; and "Model-Based OPC Using the MEEF Matrix," Nicolas Cobb and Yuri Granik, Proceedings of the SPIE 4889 (2002), pp. 1281–1292, which are herein incorporated by reference. The slope matrix 80 is calculated in a manner that is analogous to the MEEF matrix 78. Matrices for other objectives such as Imax, Imin, etc., are also analogous to the MEEF matrix 78.

At 130, the processor begins a inner loop, wherein each fragment of a mask layout section is analyzed. At 132, the processor utilizes a cost function to determine which of two or more optimization criteria should be selected for optimizing a particular edge on the wafer. One example of a cost function is shown as a flowchart in FIG. 6A and as a graph in FIG. 6B. Beginning at 160, a processor determines if a slope at the control point of an edge to be created on a wafer is less than a predetermined minimum. If so, then a movement of a fragment is selected to increases the slope of the simulated edge at a step 162. If the answer to 160 is no, the processor determines if the slope at the control point of an edge is greater than a maximum slope at 164. If so, then the movement of a fragment is selected to minimize the edge position error at 166.

If the answer to 164 is no, then the processor determines if the edge placement error at the control point of the edge is less than a minimum edge placement error at 168. If so, then a movement of a fragment is selected to maximize the slope of the edge at 170. If the answer to 168 is no, then a movement of a fragment is selected that minimizes the edge placement error at the control point of the corresponding edge or a decision is made not to move any fragments at 172. Positive negative tolerances for a simple edge may not be equal.

Returning to FIG. 5, once the optimization criteria for an edge has been selected, the gradient matrix corresponding to the selected optimization criteria is used to determine the direction and magnitude of the suggested movement at 134 in order to optimize the objective of the edge in question. In one embodiment of the invention, the processor analyzes the matrix for the selected optimization criteria and selects one or more matrix entries having the largest effect on the edge in question. Often, the matrix entry having the largest effect on the edge in question will be the entry associated with the fragment corresponding to the edge in question. However, in some instances, other fragments may have a significant effect or even greater effect on the edge in question.

At 136, it is determined if this is the last fragment in the section to be analyzed. If not, processing proceeds to a step 138, wherein the proposed change in position for the one or more fragments is stored and the next fragment is selected at 140 and analyzed at 132, 134, 136. Once all fragments have been analyzed in this section of the mask layout, a determination is made at 142 whether any non-zero changes have been stored. If so, the mask layout is revised by making the proposed changes at 144 and another simulation is performed at 124. The optimization process is repeated until there are either no non-zero changes made, or the changes to be made are small enough such that they have a negligible effect on the manufacturability of that section of the wafer. Finally, processing a section of the mask layout may halt if the solution suggested by the proposed changes is not as good as a solution obtained in a previous iteration. Therefore, processing at 142 may involve the use of another cost function that determines if a solution is "better" than a previous solution. The particular cost function to be used is selected as a matter of preference by the user.

At 146, it is determined whether this is the last section of the mask layout to be analyzed. If not, processing proceeds to 148, wherein the next section of the mask layout is obtained and processing returns to 122 in order to begin processing this next section of the mask layout. Once all sections have been processed, the optimization routine ends at 150.

As will be appreciated, the present invention allows a verification and optimization tool such as OPC to take into consideration interactions between a fragment in a mask layout and a number of edges to be created on a wafer. By using a multivariate approach, the process window is enlarged. That is, the lithographic process used to produce a circuit on a wafer creates acceptable results in under a wider set of lithographic process conditions.

While the preferred embodiment of the invention has been illustrated and described, it will be appreciated that various changes can be made therein without departing from the scope of the invention. For example, instead of stepping through fragments in a mask layout, processing can take place by analyzing each edge in the target layer. Each fragment corresponding to the edge in question is analyzed to determine if it has a significant effect on the edge as specified by the gradient matrices. If so, the fragment is moved in an iterative process until all fragments that create edges have been analyzed and each edge has objectives within predefined tolerances.

Although a preferred embodiment of the present invention optimizes two or more objectives for each edge, the present invention is not limited to optimizing two or more objective criteria for each edge. For example, a single criteria such as EPE can be optimized by moving those fragments that are specified in the MEEF matrix as having the greatest effect on an edge in question. Selecting entries in the MEEF matrix that have a significant effect on an edge in question avoids having to mathematically invert the MEEF matrix (or other matrices if other criteria are being optimized). Each term relating a fragment and the corresponding edge to be created on a wafer ideally has a unity relationship in the MEEF matrix. For example, a matrix having a unity relationship (a matrix entry equal to 1) suggests that a 1 nanometer movement of the fragment creates a corresponding 1 nanometer movement in the placement of the corresponding edge. Those fragments not associated with the edge (i.e., the cross terms in the matrix) should ideally have zero values. If the cross terms in the matrix have values greater than zero, they are considered for movement, with the cross terms having the greatest matrix entries being the most likely to be moved. Therefore, instead of mathematically inverting the matrices that describe the change in an objective versus a change in a fragment's position, the objective for an edge is modified by moving the position of fragments having non-zero matrix entries (or entries having a value above a threshold value). As will be appreciated, if the size of image created on a wafer is reduced during lithographic processing, the entries in the matrices are correspondingly scaled. Therefore, the verification tool can operate with greater speed and stability.

It will also be clear that the invention can be used in situations where exposure from a single mask is used, or where multiple exposures are used to create single set of objects on the wafer. In this case, each mask layout would comprise fragments, corresponding to some edge on the wafer, and the matrix relating the two would again be asymmetric. Examples of processes using multiple exposures are found in the use of phase-shifting masks, double exposures for use with dipole illumination, and imaging interference lithography (IIL).

It will also be appreciated that, although the cells of a target layout can be considered cell by cell, retaining the original hierarchy of the layout, the hierarchy can also be modified for optimal application of this technique. Layouts that have been completely flattened, and comprise only a single layout of hierarchy, can also be used as the input target layer for this technique.

And, although we have described this for application for the formation of images on semiconductor wafers using photomasks, it will be appreciated that this can be used for any lithographic imaging technique, including those that use dynamic micromirror arrays in place of a static photomask, and for the manufacture of other devices, such as integrated optical waveguides and devices on silica wafers, patterned magnetic media for magnetic recording, the creation of MEMS devices, etc.

The embodiments of the invention in which an exclusive property or privilege is claimed are defined as follows:

1. A method for improving the manufacturability of objects to be created on a semiconductor wafer, comprising:
   receiving a target layer that defines a number of objects to be lithographically created on a semiconductor wafer, each object having a number of edges and two or more objectives for each edge that can be optimized wherein the two or more objectives for each edge include edge placement error (EPE) and slope;
   creating a mask layout for one or more masks to be used in creating the objects on the wafer, the mask layout having a number of fragments some of which correspond to the edges to be created on the wafer;
   performing a simulation of the mask layout to predict how the edges will be created on the wafer;
   determining relationships that predict how movement of the fragments in the mask layout will affect the two or more objectives of a number of edges to be created on the wafer wherein the relationships are gradient matrices that estimate the change in EPE and slope of edges versus a change in position of a fragment in the mask layout; and
   selecting an objective for each edge to optimize using a defined tolerance, and using the relationships to determine how one or more fragments should be moved in the mask layout to optimize the selected objective of each edge.

2. The method of claim 1, wherein the position of the fragments in the mask layout is adjusted until each edge site has a slope greater than a minimum, and an EPE less than a maximum.

3. The method of claim 1, wherein the selected objective of an edge is optimized by moving one or more fragments indicated in the gradient matrices as having a significant effect on the selected objective of the edge in question.

4. The method of claim 1, wherein the simulation is performed assuming a defocused imaging for the mask.

5. The method of claim 1, wherein the relationships that predict how movement of the fragments in the mask layout will affect the two or more objectives of a number of edges to be created on the wafer are determined by:
estimating an effect on the two or more objectives of an edge caused by movement of the fragments within an optical radius of the edge.

6. A computer readable media having stored thereon a number of instructions that when executed by a computer cause the computer to perform the method of any of claims 1, 2, 3, 4, 5.

7. A method of improving the manufacturability of objects in a target layer to be created on a semiconductor wafer, comprising:
receiving a target layer that defines a number of objects to be created on a semiconductor wafer, each object having a number of edges with an objective that can be optimized;
creating a mask layout to be used in fabricating the target layer on the wafer, the mask layout defining a number of fragments, some of which correspond to edges to be created on the wafer;
performing a simulation of how the edges will be created on the wafer with the mask layout;
determining a matrix relationship that specifies how movement of a fragment in the mask layout affects the objective of a number of edges to be created on the wafer;
improving the objective of an edge to be created on the wafer by moving one or more fragments in the mask layout that have entries in the matrix relationship indicating that the fragments have a significant effect on the objective of the edge in question wherein the objective of the edges are improved by:
analyzing each edge to be created on the wafer;
determining a change in position for one or more fragments in the mask layout to improve the objective of the edge in question;
re-simulating how the edges will be created with the fragments in the mask layout in a new position; and
re-analyzing each edge in an iterative fashion until each edge has a objective within a prescribed tolerance, and wherein the objective is edge placement error (EPE).

8. The method of claim 7, wherein the objective is slope.

9. The method of claim 7, wherein the objective of the edges are improved by:
analyzing each fragment in the mask layout that creates an edge on a wafer;
determining if moving the fragment improves the objective of an edge to be created;
moving the fragment to improve the objective of the edge;
re-simulating how an edge will be created with the fragment moved; and
re-analyzing the fragments in an iterative fashion until each edge to be created on the wafer has a objective within a prescribed tolerance.

10. The method of claim 9, wherein the objective is edge placement error (EPE).

11. The method of claim 9, wherein the objective is slope.

12. The method of claim 7, wherein the matrix relationship is determined by:
determining how movement of a fragment in the mask layout affects the objective of a number of edges that are within an optical radius of the fragment.

13. A computer readable media having stored thereon a number of instructions that when executed by a computer cause the computer to perform the method of any of claims 8, 9, 10, 11, 12.

14. A method for improving the manufacturability of an integrated circuit on a wafer, comprising:
receiving a target layer that defines objects in the integrated circuit to be created on a wafer;
fragmenting the target layer so that each object to be created is defined as a number of edges, each edge having objective criteria including an edge placement error and a minimum slope;
defining a mask layout having a number of fragments some of which correspond to edges to be created on the wafer;
calculating matrices that define how the objectives of an edge are affected by changes in the position of the fragments in the mask layout;
selecting an objective for each edge to be optimized and using the matrices to determine a position of one or more fragments in the mask layout to improve the objective of the edge; and
moving the fragments in the mask layout until the edges in the target layer have required objectives.

15. A computer readable media having stored thereon a number of instructions that when executed by a computer cause the computer to perform the method of claim 14.

16. The method of claim 14, wherein the matrices are calculated for fragments that are within an optical radius of an edge.

* * * * *

UNITED STATES PATENT AND TRADEMARK OFFICE
CERTIFICATE OF CORRECTION

PATENT NO. : 6,928,634 B2  Page 1 of 1
APPLICATION NO. : 10/387224
DATED : August 9, 2005
INVENTOR(S) : Y. Granik et al.

It is certified that error appears in the above-identified patent and that said Letters Patent is hereby corrected as shown below:

On the title page items:

| | | |
|---|---|---|
| (76) Pg. 1, col. 1 | Inventors | "1632 Willow Lake La., San Jose, CA (US) 95131" should read --1496 Flamingo Way, Sunnyvale, CA (US) 94087-- |
| (57) | Abstract | "A objective" should read --An objective-- |
| (57) Pg. 1, col. 2 | Abstract 15 of text | "has acceptable" should read --has an acceptable-- |
| 9 (Claim 6, | 18 line 4) | "1, 2, 3, 4, 5." should read --1, 2, 3, 4, or 5.-- |
| 10 (Claim 13, | 25 line 4) | "8, 9, 10, 11, 12." should read --7, 8, 9, 10, 11, or 12.-- |

Signed and Sealed this

Fifteenth Day of August, 2006

JON W. DUDAS
*Director of the United States Patent and Trademark Office*